(12) United States Patent
Pyeon

(10) Patent No.: US 11,005,344 B2
(45) Date of Patent: May 11, 2021

(54) MOTOR, AND MOTOR-DRIVEN STEERING APPARATUS HAVING SAME

(71) Applicant: LG INNOTEK CO., LTD., Seoul (KR)

(72) Inventor: Jin Su Pyeon, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 16/068,036

(22) PCT Filed: Nov. 8, 2016

(86) PCT No.: PCT/KR2016/012798
§ 371 (c)(1),
(2) Date: Jul. 3, 2018

(87) PCT Pub. No.: WO2017/119584
PCT Pub. Date: Jul. 13, 2017

(65) Prior Publication Data
US 2019/0326800 A1 Oct. 24, 2019

(30) Foreign Application Priority Data
Jan. 7, 2016 (KR) .................. 10-2016-0002224

(51) Int. Cl.
*H02K 11/215* (2016.01)
*H02K 11/21* (2016.01)
(Continued)

(52) U.S. Cl.
CPC .............. *H02K 11/40* (2016.01); *H02K 5/04* (2013.01); *H02K 11/21* (2016.01); *H02K 11/215* (2016.01);
(Continued)

(58) Field of Classification Search
CPC ........ G01D 5/142; G01D 5/145; G01D 5/147; G01D 5/24438; H02K 11/21;
(Continued)

(56) References Cited

U.S. PATENT DOCUMENTS 5,719,496 A * 2/1998 Wolf ..................... G01D 5/147
324/165
5,864,192 A 1/1999 Nagate et al.
(Continued)

FOREIGN PATENT DOCUMENTS

CN 101257236 A 9/2008
EP 3127781 A2 2/2017
(Continued)

OTHER PUBLICATIONS

Yoshitomi Shiro, Flexible PCB and Magnetic Encoder using it, Apr. 26, 2007 Yaskawa Electric Corp, JP 2007108115 (English Machine Translation) (Year: 2007).*
(Continued)

*Primary Examiner* — Quyen P Leung
*Assistant Examiner* — Alexander A Singh
(74) *Attorney, Agent, or Firm* — Birch, Stewart, Kolasch & Birch LLP

(57) ABSTRACT

An embodiment of the present invention relates to a rotor position detecting apparatus and a motor and a motor-driven steering apparatus comprising same, the rotor position detecting apparatus comprising: a substrate, a magnetic Hall-signal element mounted on the substrate, and a first ground pattern disposed on one side of the substrate and electrically connected to the magnetic Hall-signal element. As a result, the motor can reduce probability of faults due to electromagnetic waves or static electricity.

20 Claims, 8 Drawing Sheets

(51) Int. Cl.
  *H02K 11/40* (2016.01)
  *H02K 5/04* (2006.01)
  *H02K 29/08* (2006.01)
  *B62D 5/04* (2006.01)
  *H05K 1/18* (2006.01)

(52) U.S. Cl.
  CPC ............... *H02K 29/08* (2013.01); *B62D 5/04* (2013.01); *H02K 2211/03* (2013.01); *H05K 1/181* (2013.01); *H05K 2201/10151* (2013.01)

(58) Field of Classification Search
  CPC ...... H02K 11/215; H02K 29/08; H02K 29/06; H02K 29/14; H02K 11/40; H02K 5/04; H02K 5/225; H02K 2211/03; B62D 5/04; H05K 1/181; H05K 2201/10151
  USPC .......................................... 310/68 B, 68 E, 71
  See application file for complete search history.

(56) References Cited

U.S. PATENT DOCUMENTS

| | | | |
|---|---|---|---|
| 2002/0067093 A1* | 6/2002 | Das | H02P 6/08 310/179 |
| 2008/0211356 A1* | 9/2008 | Kataoka | B62D 5/0403 310/68 B |
| 2009/0078058 A1* | 3/2009 | Aoki | G01L 5/221 73/862.335 |
| 2013/0026888 A1 | 1/2013 | Migita et al. | |
| 2013/0126258 A1 | 5/2013 | Jung et al. | |
| 2014/0130612 A1 | 5/2014 | Takahashi et al. | |
| 2014/0167572 A1 | 6/2014 | Woo | |
| 2015/0326157 A1* | 11/2015 | Aoshima | H02K 29/08 318/685 |
| 2016/0020676 A1* | 1/2016 | Omura | B24B 23/028 310/50 |
| 2016/0276907 A1 | 9/2016 | Kloer et al. | |

FOREIGN PATENT DOCUMENTS

| | | | |
|---|---|---|---|
| JP | 8-317604 A | | 11/1996 |
| JP | 2001349747 A | * | 12/2001 |
| JP | 2003-143812 A | | 5/2003 |
| JP | 2007108115 A | * | 4/2007 |
| JP | 2007-252096 A | | 9/2007 |
| JP | 2011-87449 A | | 4/2011 |
| JP | 2012-60811 A | | 3/2012 |
| JP | 5056310 B2 | | 10/2012 |
| JP | 2013-31298 A | | 2/2013 |
| JP | 2014-75889 A | | 4/2014 |
| KR | 10-2013-0055858 A | | 5/2013 |
| KR | 10-2014-0063403 A | | 5/2014 |
| KR | 10-2015-0115463 A | | 10/2015 |
| WO | WO 2015/067497 A2 | | 5/2015 |

OTHER PUBLICATIONS

Hori et al, Encoder for Synchronous Motor, Apr. 8, 2004, Denso Corp, JP 2001349747 (English Machine Translation) (Year: 2004).*

* cited by examiner

[Figure 1]
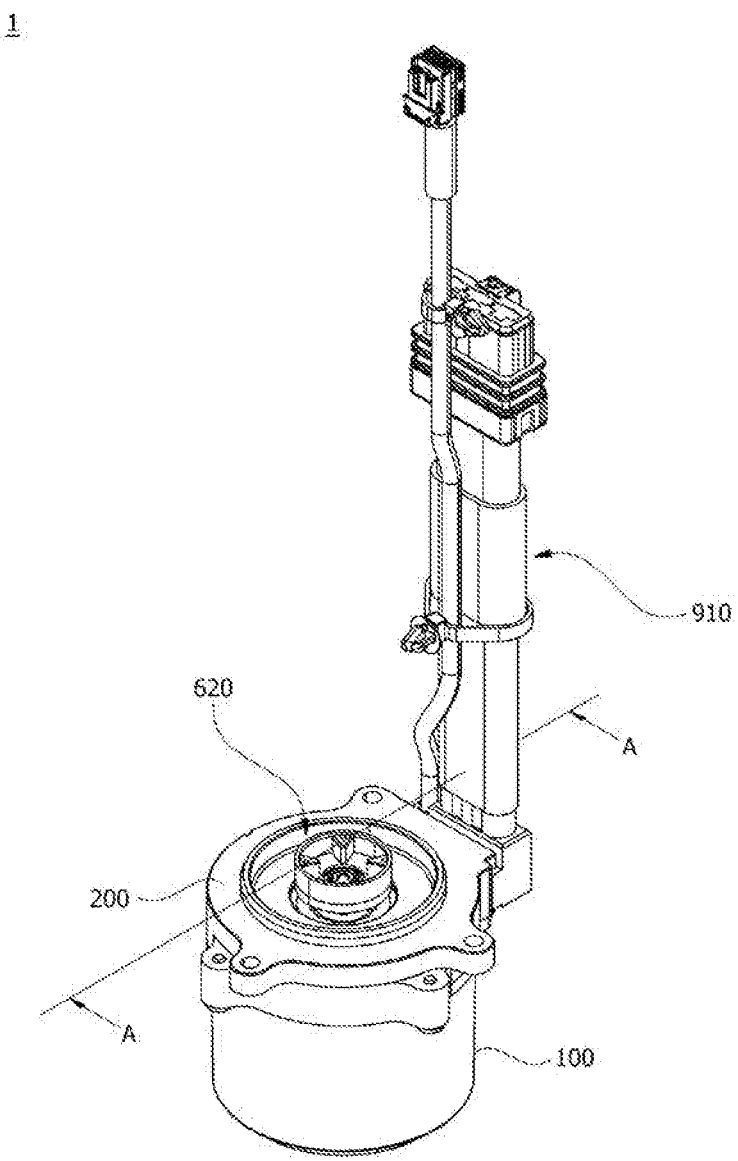

[Figure 2]
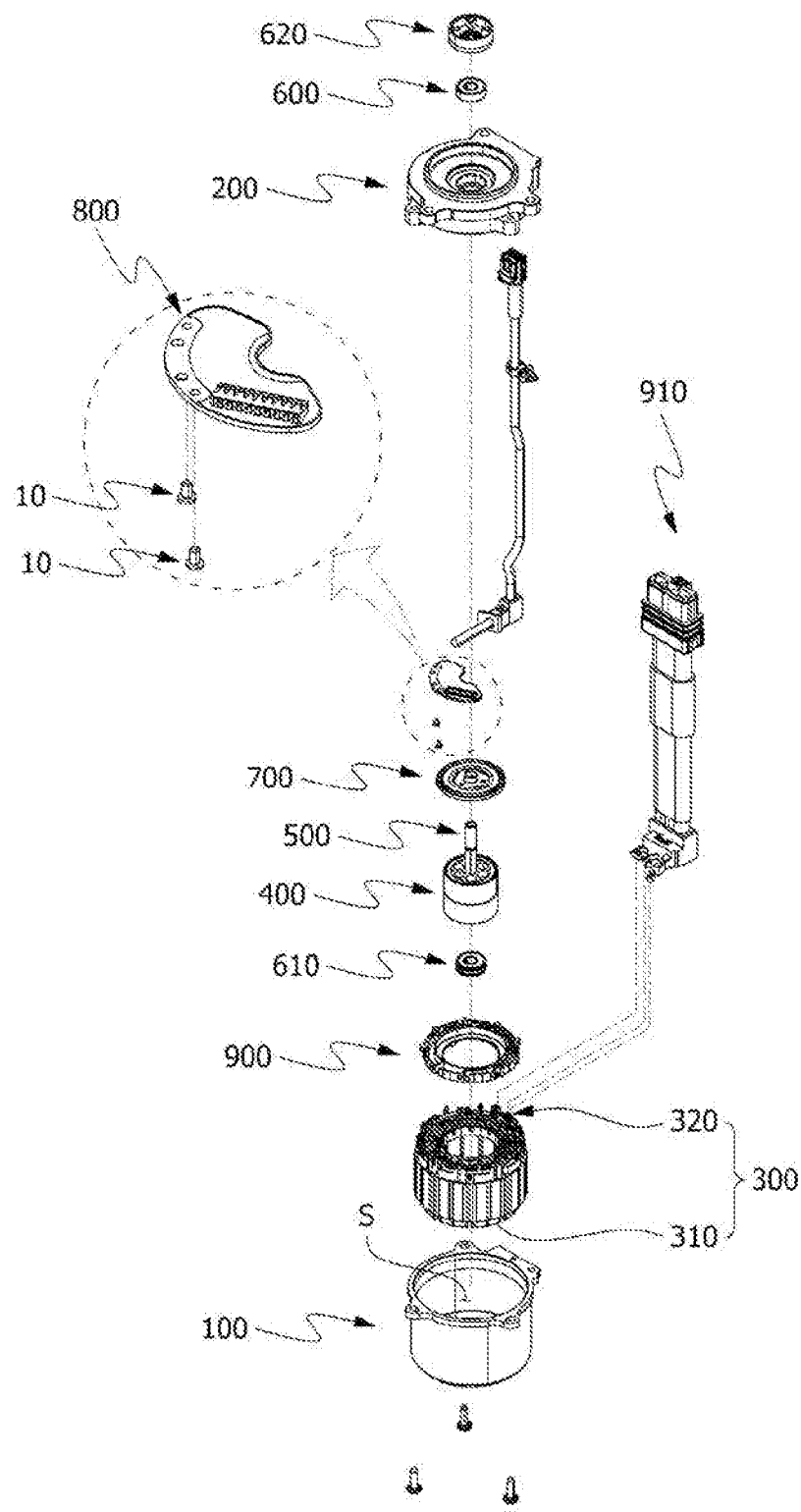

[Figure 3]
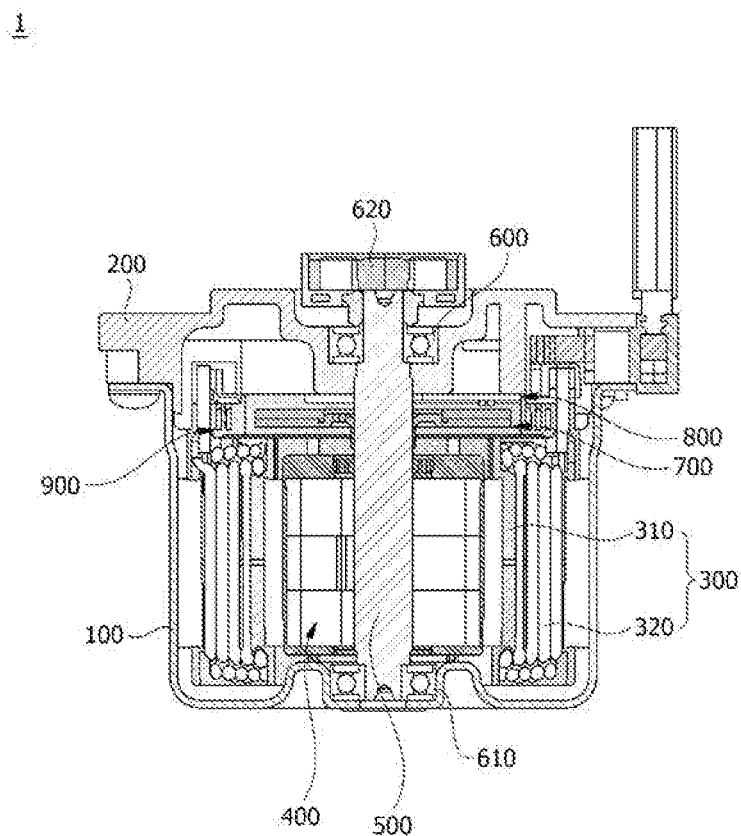
[Figure 4]
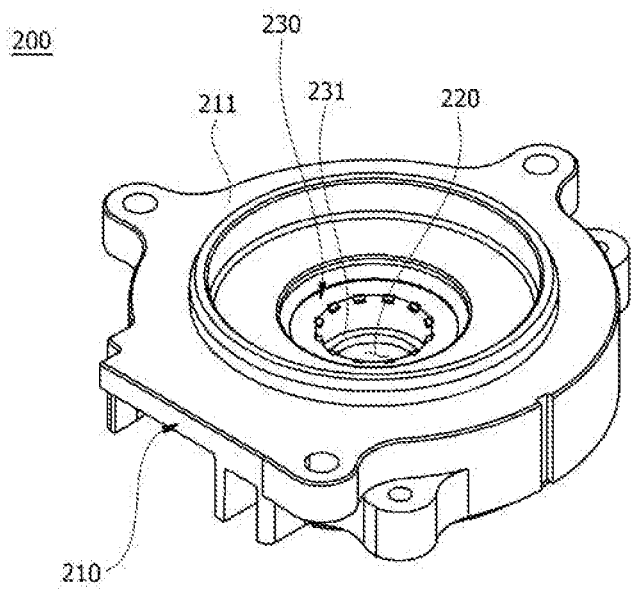

[Figure 5]
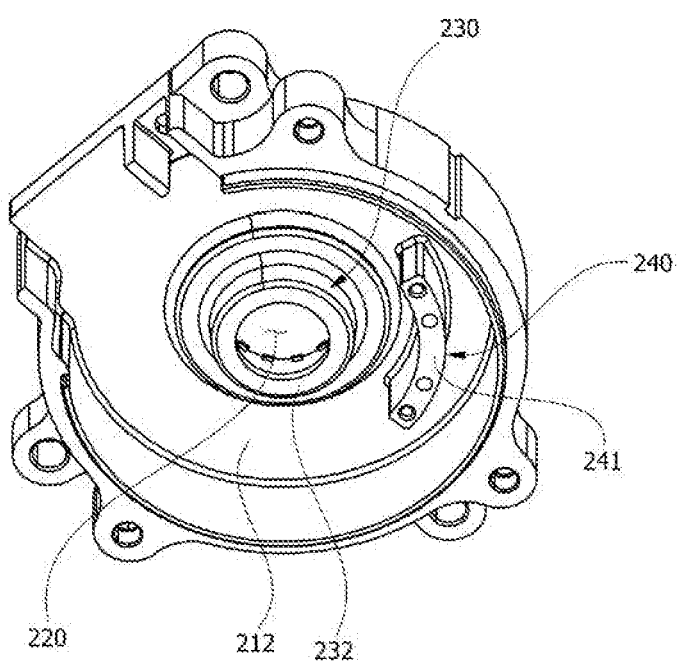

[Figure 6]
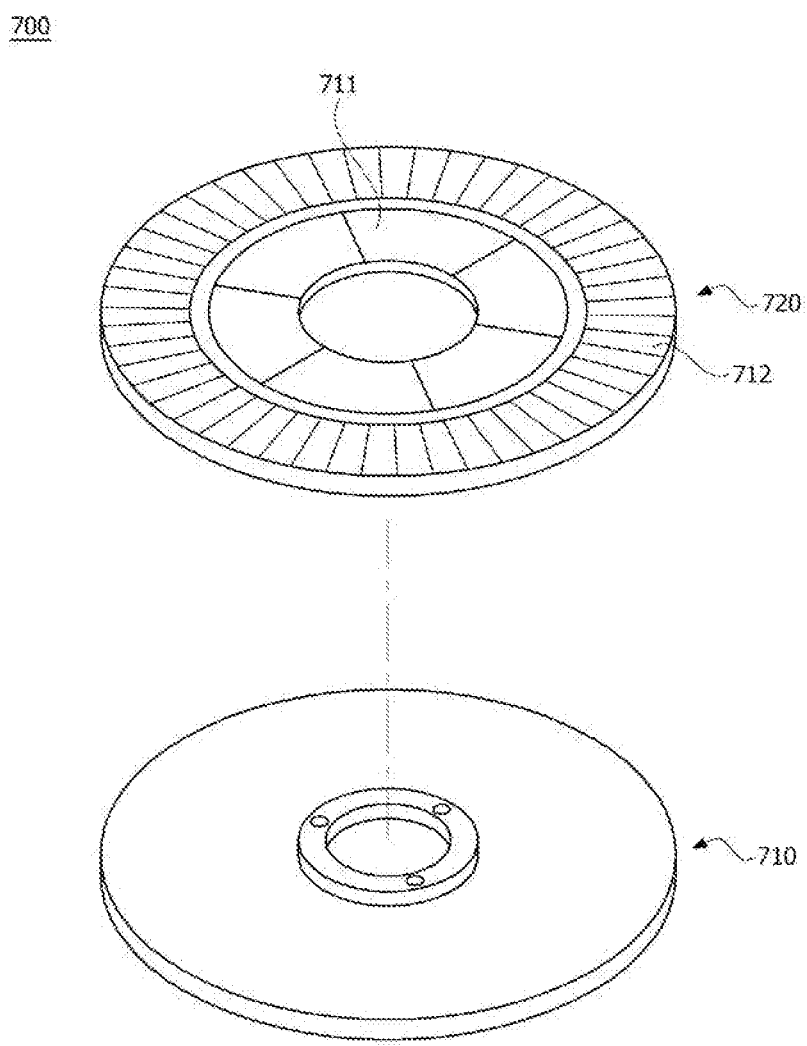

【Figure 8A】
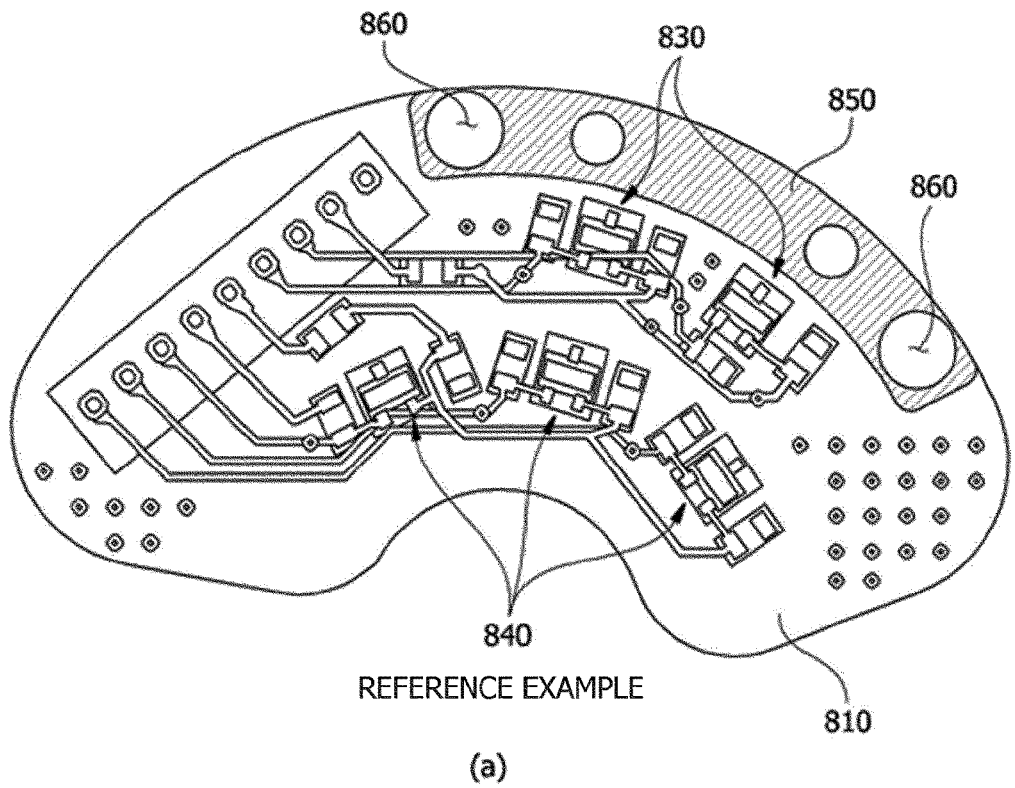
REFERENCE EXAMPLE
(a)
【Figure 8B】
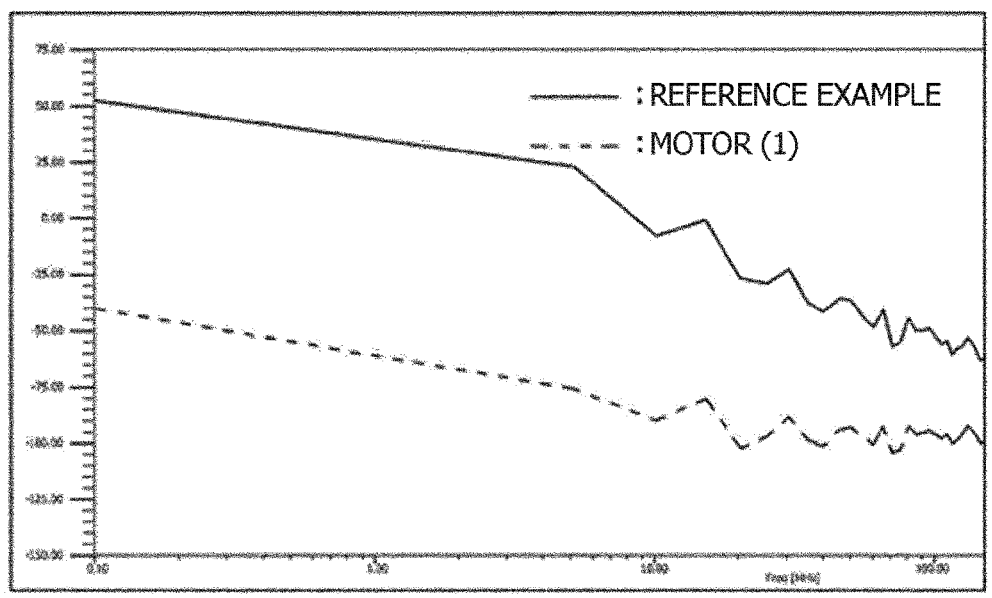
(b)

[Figure 9]
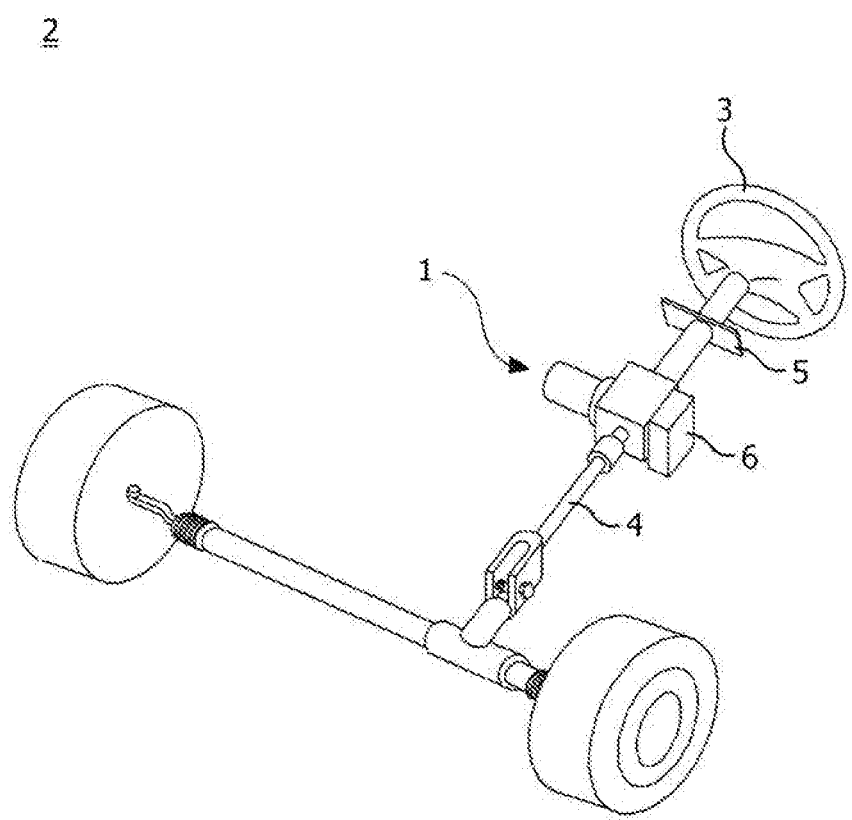

MOTOR, AND MOTOR-DRIVEN STEERING APPARATUS HAVING SAME

CROSS REFERENCE TO RELATED APPLICATIONS

This application is the National Phase of PCT International Application No. PCT/KR2016/012798, filed on Nov. 8, 2016, which claims priority under 35 U.S.C. 119(a) to Patent Application No. 10-2016-0002224, filed in the Republic of Korea on Jan. 7, 2016, all of which are hereby expressly incorporated by reference into the present application.

TECHNICAL FIELD

The present invention relates to a motor and a motor-driven steering apparatus including the same.

BACKGROUND ART

Generally, a rotor is rotated due to an electromagnetic interaction between the rotor and a stator in a motor. Here, since a rotational shaft inserted into the rotor is also rotated, a rotational driving force is generated.

A sensor including a magnetic element is disposed inside the motor as a rotor position detecting apparatus. The sensor grasps a present position of the rotor by detecting a magnetic force of the sensing magnet installed to be rotatable in conjunction with the rotor.

The sensor may include a plurality of magnetic elements. Here, in addition to three magnetic elements for feedback on U-phase, V-phase, and W-phase information, two magnetic elements for grasping a rotation direction of the motor and a more precise rotation angle are additionally installed in the sensor. The two magnetic elements are disposed to be spaced a predetermined distance from each other in a circumferential direction of the sensing magnet. Accordingly, sensing signals detected by the two magnetic elements have a phase difference, and thus the rotation direction of the motor and the rotation angle are more precisely grasped.

Since the magnetic elements may be mounted on a printed circuit board and disposed in a housing of the motor and have a structure vulnerable to electromagnetic interference (EMI), there is a high possibility of EMI failure during an EMI test.

Accordingly, there is a problem in that there is a high possibility of failure of the magnetic element during an electrostatic discharge (ESD) test.

DISCLOSURE

Technical Problem

The present invention is directed to providing a motor, in which a ground pattern corresponding to a Hall integrated circuit (IC) is formed on a substrate to reduce a possibility of failure due to electromagnetic interference (EMI) or static electricity, and a motor-driven steering apparatus including the same.

Objectives to be achieved by the embodiments of the present invention are not limited to the above-described objectives, and other objectives, which are not described above, may be clearly understood by those skilled in the art through the following specification.

Technical Solution

One aspect of the present invention provides a motor including: a housing in which an opening is formed at one side thereof and an accommodation space is formed; a bracket disposed to cover the opening of the housing; a stator disposed in the accommodation space; a rotor disposed in the stator; a shaft coupled to the rotor; a sensing magnet assembly disposed above the roto; and a rotor position detecting apparatus configured to detect a change in magnetic flux of the sensing magnet assembly, wherein the rotor position detecting apparatus includes a substrate, a Hall signal magnetic element mounted on the substrate, an encoder signal magnetic element mounted on the substrate, and a first ground pattern formed on the substrate, and the first ground pattern is electrically connected to the Hall signal magnetic element.

The first ground pattern may be disposed at an inner side of the substrate with respect to a virtual line (C) passing through a center in a circumferential direction of the substrate.

The motor may further include a second ground pattern electrically connected to the encoder signal magnetic element and formed at an outer edge of the substrate with respect to the virtual line (C) passing through the center in the circumferential direction of the substrate.

The bracket may include: a bracket main body; a coupling hole which is formed in a center of the bracket main body and in which the shaft is disposed; a seating portion concavely formed around the coupling hole toward the rotor; and a coupling part formed to protrude from a lower surface of the bracket main body.

The second ground pattern may be fixedly in contact with one side of the coupling part by a fixing member.

The second ground pattern may be in contact with the coupling part by the fixing member, and the first ground pattern may be in contact with one side of the seating portion.

The sensing magnet assembly may include: a sensing plate; and a sensing magnet seated on the sensing plate, wherein the sensing plate may be coupled to the shaft so as to rotate.

The sensing magnet may include: a main magnet disposed at a center of the sensing plate; and a sub-magnet disposed at an edge of the sensing plate, wherein the Hall signal magnetic element may detect a change in magnetic flux of the main magnet, and the encoder signal magnetic element may detect a change in magnetic flux of the sub-magnet.

With respect to a virtual line (C) passing through the center in the circumferential direction of the substrate, the Hall signal magnetic element may be disposed at an inner side of the substrate, and the encoder signal magnetic element may be disposed at an outer side of the substrate.

The main magnet may include a plurality of split magnets, and the number of the split magnets may be the same as that of magnets of the rotor.

Another aspect of the present invention provides a motor-driven steering apparatus including: a steering shaft; and a motor connected to the steering shaft, wherein the motor includes the above-described motor.

Advantageous Effects

A rotor position detecting apparatus according to the embodiment including the above-described structure can reduce a possibility of electromagnetic interference (EMI) failure of a motor due to a Hall integrated circuit (IC).

In addition, the rotor position detecting apparatus can reduce a possibility of electrostatic failure of the motor.

DESCRIPTION OF DRAWINGS

FIG. 1 is a perspective view illustrating a motor according to an embodiment.

FIG. 2 is an exploded perspective view illustrating the motor according to the embodiment.

FIG. 3 is a cross-sectional view illustrating the motor according to the embodiment, taken along line A-A of FIG. 1.

FIG. 4 is a perspective view illustrating a bracket of the motor according to the embodiment.

FIG. 5 is a bottom perspective view illustrating the bracket of the motor according to the embodiment.

FIG. 6 is a view illustrating a sensing magnet assembly of the motor according to the embodiment.

FIG. 8 is a view showing improved electromagnetic interference (EMI) of the motor according to the embodiment when compared with a reference example.

FIG. 9 is a view illustrating a motor-driven steering apparatus according to an embodiment.

MODES OF THE INVENTION

Figure 7:
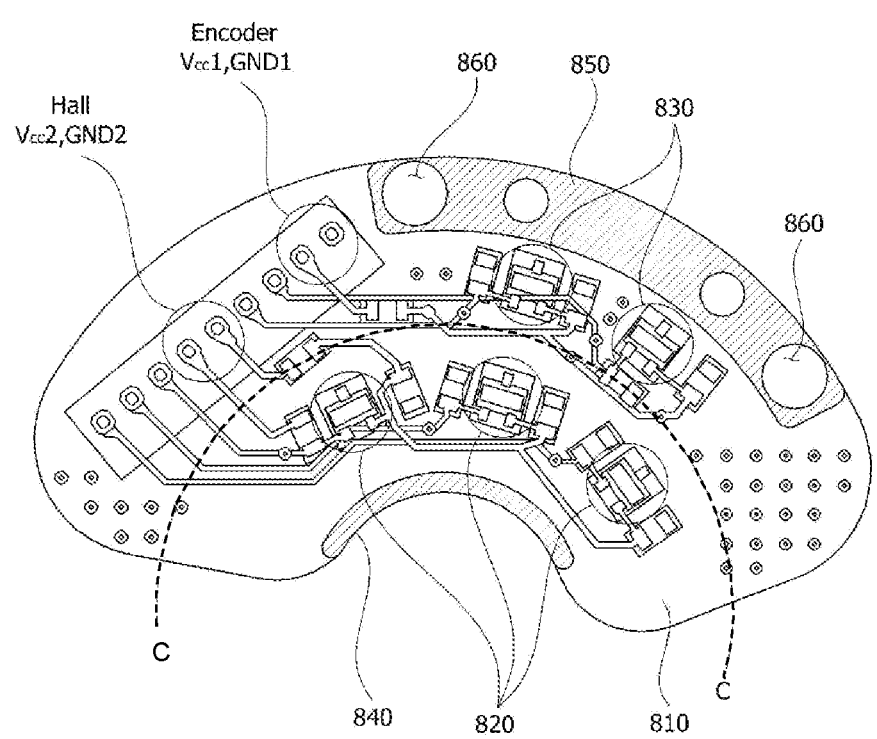
FIG. 7 is a view illustrating a rotor position detecting apparatus of the motor according to the embodiment.

While the invention can be modified in various ways and take on various alternative forms, specific embodiments thereof are shown in the drawings and described in detail below as examples. However, it should be understood that there is no intent to limit the invention to the particular forms disclosed, but on the contrary, the invention covers all modifications, equivalents, and alternatives falling within the spirit and scope of the present invention.

It will be understood that, although the terms "first," "second," etc. may be used herein to describe various elements, these elements should not be limited by these terms. These terms are only used to distinguish one element from another. For example, a first element could be called a second element, and a second element could similarly be called a first element without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements.

In a description of the embodiments, in a case in which any one element is described as being formed on (or under) another element, such a description includes both a case in which the two elements are formed to be in direct contact with each other and a case in which the two elements are in indirect contact with each other such that one or more other elements are interposed between the two elements. In addition, when in a case in which one element is described as being formed on (or under) the other element, such a description may include a case in which one element is formed at an upper side or a lower side with respect to the other element.

The terminology used herein to describe embodiments of the invention is not intended to limit the scope of the invention. The articles "a," and "an" are singular in that they have a single referent, however, the use of the singular form in the present document should not preclude the presence of more than one referent. In other words, elements of the invention referred to in the singular may number one or more, unless the context clearly indicates otherwise. It will be further understood that the terms "comprise," "compris-ing," "include," and/or "including," when used herein, specify the presence of stated features, numbers, steps, operations, elements, components, and/or combinations thereof, but do not preclude the presence or addition of one or more other features, numbers, steps, operations, elements, components, and/or combinations thereof.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

Hereinafter, exemplary embodiments of the invention will be described in detail with reference to the accompanying drawings. The same or corresponding elements will be consistently denoted by the same respective reference numerals and described in detail no more than once regardless of drawing symbols.

In a motor according to an embodiment of the present invention, a ground pattern corresponding to a Hall integrated circuit (IC) is formed on a substrate to reduce a possibility of failure due to electromagnetic interference (EMI) or static electricity.

Referring to FIGS. 1 to 9, a motor 1 according to the embodiment of the present invention may include a housing 100, a bracket 200, a stator 300 disposed inside the housing 100, a rotor 400 rotatably disposed in the stator 300, a shaft 500 inserted into the rotor 400 by passing therethrough and rotated in conjunction with the rotor 400, a bearing 600, a sensing magnet assembly 700, a rotor position detecting apparatus 800, and a busbar 900.

In addition, the motor 1 may further include a lower bearing 610 disposed to support rotation of the shaft 500, a coupler 620 disposed at an end of one side of the shaft 500, a busbar power line 910, and the like.

The housing 100 may be formed in a cylindrical shape. In addition, an accommodation space S in which the stator 300, the rotor 400, and the busbar 900 may be installed is provided in the housing 100.

As illustrated in FIG. 1, the housing 100 may be forged in the cylindrical shape and may include an opening formed at one side of the housing 100 and the accommodation space S formed to communicate with the opening. Here, a shape or material of the housing 100 may be variously changed, but the housing 100 may be formed of a metal material which can withstand high temperatures well.

The housing 100 is coupled to the bracket 200 disposed to cover the opening to shield the stator 300 and the rotor 400 from the outside. In addition, the housing 100 may further include a cooling structure (not shown) to easily discharge internal heat. The cooling structure may include an air- or water-cooling structure, and the shape of the housing 100 may be suitably changed according to the cooling structure.

Referring to FIGS. 4 and 5, the bracket 200 may include a bracket main body 210 having a plate shape, a coupling hole 220 formed at a center of the bracket main body 210, a seating portion 230 formed in a concave shape around the coupling hole 220, and a coupling part 240.

The bracket main body 210 may be disposed to cover the opening of the housing 100.

As illustrated in FIG. 4, the seating portion 230 may be formed in the concave shape from an upper surface 211 of the bracket main body 210 at a center of the bracket main body 210 toward the rotor 400. In addition, the coupling hole 220 may be formed at a center of the seating portion 230 such that the shaft 500 is disposed.

Accordingly, the bearing 600 may be disposed on a seating surface 231 of the seating portion 230 to rotatably support the shaft 500.

As illustrated in FIG. 5, the coupling part 240 may be formed to protrude from a lower surface 212 of the bracket main body 210. Here, the coupling part 240 may be disposed to be spaced apart from the seating portion 230.

In addition, the coupling part 240 may be fixedly in contract with one side of the rotor position detecting apparatus 800 by a fixing member 10 such as a bolt, a screw, or the like. More specifically, a second ground pattern 850 of the rotor position detecting apparatus 800 may be fixedly in contact with a contact surface 241 of the coupling part 240 by the fixing member 10.

In addition, as the second ground pattern 850 is fixedly in contact with the contact surface 241 of the coupling part 240 by the fixing member 10, a first ground pattern 840 may be disposed to be in close contact with a contact surface 232 of the seating portion 230.

The stator 300 is inserted into the accommodation space S of the housing 100. The stator 300 may include stator cores 310 and coils 320 wound around the stator core 310. The stator core 310 may be an integrated core formed in a ring shape or may also be a core in which a plurality of separated cores are combined.

The stator 300 may be suitably changed according to a type of the motor. For example, the stator 300 may be manufactured such that, in the case of a direct current (DC) motor, a coil may be wound around an integrated stator core, and in the case of a three-phase control motor, the U-phase, V-phase, and W-phase are respectively input to a plurality of coils.

The busbar 900 may be disposed above the stator 300, and the coils 320 of the stator 300 may be connected to the busbar 900. Here, a plurality of metal members (terminals) electrically connected to the coils 320 may be insulated by an insulator and fixedly disposed on the busbar 900.

The rotor 400 may be rotatably disposed in the stator 300. A magnet is disposed at the rotor 400, and electromagnetically interacts with the stator 300 to rotate the rotor 400.

The shaft 500 is coupled to a central portion of the rotor 400. Accordingly, when the rotor 400 rotates, the shaft 500 also rotates. Here, the shaft 500 may be rotatably supported by the bearing 600.

The shaft 500 is coupled to an external apparatus to provide power to the external apparatus. As an example, in a case in which the motor 1 is used as an electric power steering (EPS) motor, the shaft 500 may be connected to a vehicle steering shaft to provide assistant steering power to the vehicle steering shaft.

The rotor position detecting apparatus 800 according to one embodiment of the present invention detects a change in magnetic flux in the sensing magnet assembly 700 rotated in conjunction with the shaft 500 to detect a rotational position of the rotor 400.

Referring to FIG. 6, the sensing magnet assembly 700 may include a sensing plate 710 and a sensing magnet 720 seated on the sensing plate 710. The sensing plate 710 may be coupled to the shaft 500 so as to be rotatable.

The sensing magnet 720 may be formed in a circular disk shape and may include a main magnet 711 disposed at a central portion of the sensing plate 710, a sub-magnet 712 disposed at an edge of the sensing plate 710. The main magnet 711 includes a plurality of split magnets formed in a split ring shape. The number of the split magnets (poles) of the main magnet 711 is the same as the number of the rotor magnets (poles) so that the rotation of the rotor may be detected.

The sub-magnet 712 is disposed at the edge of the circular disk and includes a number of split magnets (poles) larger than the main magnet 711. Accordingly, one pole (split magnet) of the main magnet 711 is disassembled by further subdivision. Accordingly, an amount of rotation may be more precisely measured. Here, in the sub-magnet 712, an N-pole split magnet and a S-pole split magnet may be alternately disposed.

Referring to FIG. 7, the rotor position detecting apparatus 800 may include a substrate 810, a plurality of Hall signal magnetic elements 820 disposed to be spaced a predetermined distance from each other on the substrate 810, a plurality of encoder signal magnetic elements 830 disposed to be spaced a predetermined distance from each other on the substrate 810, the first ground pattern 840 electrically connected to the Hall signal magnetic elements 820, the second ground pattern 850 electrically connected to the encoder signal magnetic elements 830, and fixing holes 860.

The magnetic elements 820 and 830 may be disposed on the substrate 810 to be spaced apart from the sensing magnet assembly 700 and may calculate a rotation angle according to a change in magnetic flux. Here, the magnetic elements 820 and 830 may be a Hall IC, and Vccs and grounds GND of the magnetic elements 820 and 830 may be separated from each other as illustrated in FIG. 7.

Referring to FIG. 7, the substrate 810 may be formed as a plate having an arc shape. In addition, the Hall signal magnetic elements 820 and the first ground pattern 840 may be disposed at an inner side of the substrate 810 with reference to a virtual line C drawn in a circumferential direction at a center of the substrate 810.

Here, the term 'outer side' refers to an outer side with respect to the virtual line C in a radial direction from a rotational center of the shaft 500, and the term 'inner side' refers to an inner side with respect to the virtual line C in the radial direction from the rotational center of the shaft 500.

The first ground pattern 840 may be formed in an arc shape and disposed at an inner edge of the substrate 810. In addition, the first ground pattern 840 may be electrically connected to the ground GND of the Hall signal magnetic element 820.

In addition, the first ground pattern 840 may be disposed to be in close contact with one side of the bracket 200. For example, the first ground pattern 840 may be disposed to be in close contact with the contact surface 232 located at a side opposite the seating surface 231 of the bracket 200.

Accordingly, an area of the ground GND of the Hall signal magnetic element 820 increases relatively, and accordingly, a possibility of EMI or electrostatic failure of the motor 1 due to the Hall signal magnetic element 820 may decrease.

Meanwhile, the encoder signal magnetic elements 830 and the second ground pattern 850 may be disposed at the outer side of the substrate 810 with respect to the virtual line C drawn in the circumferential direction of the substrate 810.

Here, the second ground pattern 850 may be formed in an arc shape and disposed at an outer edge of the substrate 810. In addition, the second ground pattern 850 may be electrically connected to the ground GND of the encoder signal magnetic element 830.

In addition, the second ground pattern 850 may be disposed to be in close contact with the coupling part 240 of the bracket 200. That is, the second ground pattern 850 may be fixedly disposed to be in close contact with the coupling part 240 by the fixing member 10 disposed to pass through the fixing hole 860.

In addition, as an end portion of the fixing member 10 is coupled to the coupling part 240, the first ground pattern 840 may also be disposed to be in close contact with the contact surface 232.

FIG. 8 is a view showing improved EMI of the motor according to one embodiment of the present invention. That is, FIG. 8A is a view illustrating the rotor position detecting apparatus 800 from which the first ground pattern 840 is removed (reference example), and FIG. 8B is a comparison graph between EMI of the reference example and improved EMI of the motor 1.

As illustrated in FIG. 8B, EMI of the motor 1 is improved by about 160% due to the first ground pattern 840, compared to the reference example.

Hereinafter, an operation of detecting a position of the rotor 400 using the rotor position detecting apparatus 800 and the sensing magnet assembly 700 will be described.

The rotor position detecting apparatus 800 may include a plurality of magnetic elements 820 and 830 configured to detect a change in magnetic flux according to rotation of the sensing magnet assembly 700 to detect a position of the rotor 400.

Since the main magnet 711 of the sensing magnet assembly 700 is provided to correspond to the magnet of the rotor 400, a change in magnet flux of the main magnet 711 has to be detected to detect a position of the rotor 400.

The rotor position detecting apparatus 800 may detect a change in magnetic flux of the main magnet 711 through the Hall signal magnetic element 820 to detect three sensing signals. In addition, the rotor position detecting apparatus 800 may detect a change in magnetic flux of the sub-magnet 712 through the encoder signal magnetic element 830 to detect two sensing signals. Here, a rotation direction and a precise rotation angle of the motor may be calculated using the two sensing signals.

Meanwhile, a motor-driven steering apparatus (or electric power steering (EPS)) 2 according to an embodiment of the present invention may include the motor 1.

Referring to FIG. 9, the motor-driven steering apparatus 2 may include the motor 1, a steering wheel 3, a steering shaft 4, a steering angle sensor 5, and an electronic control unit (ECU) 6.

The steering wheel 3 is generally called as a handle, and a driver rotates the steering wheel 3 to change a direction of a vehicle. The steering wheel 3 may be disposed to be connected to the steering shaft 4, and when the driver rotates the steering wheel 3, the steering shaft 4 is rotated in conjunction with the rotation of the steering wheel 3 in a direction the same as that of the steering wheel 3.

The motor 1 is a motor configured to assist a torque for the driver to manipulate the steering wheel 3 to steer and assists the driver to more easily steer the vehicle.

A reduction apparatus and a torque sensor (not shown) may be coupled to one end of the motor 1. The torque sensor detects a relative rotational displacement between an input shaft and an output shaft according to rotation of the steering wheel 3, generates an electric signal, and transmits the electric signal to the ECU 6.

The steering angle sensor 5 is installed near the steering wheel 3, and directly measures a rotation angle of the steering wheel 3 rotated by manipulation of the driver. In addition, the steering angle sensor 5 transmits a signal related to the measured rotation angle to the ECU 6.

The ECU 6 may electronically control various driving sources of the motor-driven steering apparatus including the motor 1 on the basis of information of a vehicle speed sensor, which is not shown, and the torque sensor and the steering angle sensor 5.

Here, the motor 1 may be connected to the steering shaft of the motor-driven steering apparatus 2.

While the present invention has been described with reference to exemplary embodiments, it will be understood by those skilled in the art that various changes and modifications may be made without departing from the spirit and scope of the present invention as defined by the appended claims. In addition, it will be interpreted that differences related to the changes and modifications fall within the scope of the present invention defined by the appended claims.

REFERENCE NUMERALS

1: MOTOR
2: MOTOR-DRIVEN STEERING APPARATUS
3: STEERING WHEEL
4: STEERING SHAFT
5: STEERING ANGLE SENSOR
6: ELECTRONIC CONTROL UNIT
100: HOUSING
200: BRACKET
300: STATOR
400: ROTOR
500: SHAFT
600: BEARING
700: SENSING MAGNET ASSEMBLY
800: ROTOR POSITION DETECTING APPARATUS
900: BUSBAR

The invention claimed is:

1. A motor comprising:
a rotor;
a stator disposed in correspondence with the rotor;
a magnet assembly disposed on the rotor; and
a detecting apparatus on the magnet assembly,
wherein the detecting apparatus includes:
 a substrate;
 a first magnetic element part and a second magnetic element part disposed on the substrate; and
 a first ground pattern and a second ground pattern disposed on the substrate,
 wherein the first ground pattern has a first arcuate portion with a first radius of curvature disposed adjacent to an inner side of the substrate, and the second ground pattern has a second arcuate portion with a second radius of curvature disposed adjacent to an outer side of the substrate,
 wherein the first ground pattern is electrically connected to the first magnetic element part,
 wherein the second ground pattern is electrically connected to the second magnetic element part, and
 wherein the first ground pattern and the second ground pattern are separated from each other.

2. The motor of claim 1, wherein a power terminal of the first magnetic element part and a power terminal of the second magnetic element part are separated from each other.

3. The motor of claim 2, wherein the power terminal of the second magnetic element is disposed closer to the second ground pattern than the first ground pattern.

4. The motor of claim 1, further comprising:
a first ground terminal connected to the first ground pattern; and a second ground terminal connected to the second ground pattern,
wherein the second ground terminal is disposed closer to the second ground pattern than the first ground pattern.

5. The motor of claim 4, wherein the second ground terminal is disposed at the outer side of the substrate.

6. The motor of claim 1, wherein the first magnetic element part is electrically disconnected from the second magnetic element part.

7. The motor of claim 1, wherein the magnet assembly includes a plate, a main magnet disposed on the plate, and a sub-magnet surrounded with the main magnet.

8. The motor of claim 1, wherein the first magnetic element part includes a plurality of first magnetic elements,
wherein at least a part of the plurality of first magnetic elements is disposed on a first arc having a first radius,
wherein the second magnetic element part includes a plurality of second magnetic elements,
wherein at least a part of the plurality of second magnetic elements is disposed on a second arc having a second radius, and
wherein the first radius is different from the second radius.

9. The motor of claim 1, wherein the first ground pattern is disposed on one side of the substrate, and
wherein the second ground pattern is disposed on an other side of the substrate.

10. The motor of claim 1, further comprising a bracket coupled with the substrate,
wherein the substrate includes a hole for being coupled with the bracket.

11. The motor of claim 10, wherein the hole is spaced apart from the first ground pattern.

12. The motor of claim 10, wherein the hole is disposed closer to an outer edge of the substrate than an inner edge of the substrate.

13. The motor of claim 1, wherein an outer edge of the substrate is disposed closer to the second ground pattern than the first ground pattern.

14. The motor of claim 1, wherein the first magnetic element part is a Hall signal magnetic element, and
wherein the second magnetic element part is an encoder signal magnetic element.

15. A motor comprising:
a rotor;
a stator disposed in correspondence with the rotor;
a substrate disposed on the rotor;
a first magnetic element part and a second magnetic element part disposed on the substrate;
a first ground pattern electrically connected to the first magnetic element part; and
a second ground pattern electrically connected to the second magnetic element part,
wherein the first ground pattern has a first arcuate portion with a first radius of curvature disposed adjacent to an inner side of the substrate, and the second ground pattern has a second arcuate portion with a second radius of curvature disposed adjacent to an outer side of the substrate,
wherein a power terminal of the first magnetic element part and a power terminal of the second magnetic element part are separated from each other, and
wherein the first magnetic element part is electrically disconnected from the second magnetic element part.

16. The motor of claim 15, wherein the first magnetic element part includes a plurality of first magnetic elements,
wherein at least a part of the plurality of first magnetic elements is disposed on a first arc having a first radius,
wherein the second magnetic element part includes a plurality of second magnetic elements,
wherein at least a part of the plurality of second magnetic elements is disposed on a second arc having a second radius, and
wherein the first radius is different from the second radius.

17. The motor of claim 16, wherein at least the part of the plurality of first magnetic elements detects a pole change of a main magnet, and
wherein at least the part of the plurality of second magnetic elements detects a pole change of a sub-magnet.

18. The motor of claim 15, further comprising a magnet disposed on the rotor, wherein the magnet includes a main magnet and a sub-magnet surrounded with the main magnet.

19. The motor of claim 15, wherein the first ground pattern is disposed on one side of the substrate, and
wherein the second ground pattern is disposed on the other side of the substrate.

20. A motor comprising:
a rotor;
a stator disposed in correspondence with the rotor;
a substrate disposed on the rotor;
a magnet disposed between the rotor and the substrate;
a first magnetic element part and a second magnetic element part disposed on the substrate;
a first ground pattern and a second ground pattern disposed on the substrate, substrate; and
a first ground terminal of the first magnetic element part, a second ground terminal of the second magnetic element part, a first power terminal of the first magnetic element part and a second power terminal of the second magnetic element part disposed on the substrate,
wherein the first ground pattern is connected to the first ground terminal of the first magnetic element part,
wherein the second ground pattern is connected to the second ground terminal of the second magnetic element part,
wherein the first ground pattern is separated from the second ground pattern,
wherein the first power terminal of the first magnetic element part and the second power terminal of the second magnetic element part are separated from each other,
wherein the first magnetic element part comprises a plurality of first magnetic elements disposed on a first arc having a first radius,
wherein the second magnetic element part comprises a plurality of second magnetic elements disposed on a second arc having a second radius, and
wherein each of the first magnetic element part and second magnetic element part are driven independently.

* * * * *